(12) United States Patent
Adachi

(10) Patent No.: US 6,265,940 B1
(45) Date of Patent: Jul. 24, 2001

(54) DETECTOR AND TRANSMITTER INCORPORATING THE DETECTOR

(75) Inventor: Keigo Adachi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/563,837

(22) Filed: May 4, 2000

(30) Foreign Application Priority Data

Jan. 18, 2000 (JP) .................................................. 12-008727

(51) Int. Cl.$^7$ ................................. H03G 3/20; H03D 1/10
(52) U.S. Cl. ............................ 330/140; 329/365; 329/366
(58) Field of Search ............................ 330/140; 329/365, 329/366

(56) References Cited

U.S. PATENT DOCUMENTS

| | | | |
|---|---|---|---|
| 5,764,107 | * | 6/1998 | Stone .................................... 330/140 |
| 5,796,309 | * | 8/1998 | Nguyen ................................ 330/140 |
| 6,084,920 | * | 7/2000 | Ferdinandsen ...................... 330/140 |

FOREIGN PATENT DOCUMENTS

| | | |
|---|---|---|
| 5191180 | 7/1993 | (JP) . |
| 8228119 | 9/1996 | (JP) . |
| 8330850 | 12/1996 | (JP) . |

* cited by examiner

*Primary Examiner*—Robert Pascal
*Assistant Examiner*—Patricia T. Nguyen
(74) *Attorney, Agent, or Firm*—Rothwell, Figg, Ernst & Manbeck

(57) ABSTRACT

A detector comprises a first diode for detecting a high-frequency signal applied to the detector, a bias unit for supplying a predetermined bias voltage to the first diode; a first resistor having an end connected to the bias unit and another end connected to the first diode, a second diode connected in series with the first diode and having a same characteristic as the first diode, a second resistor having an end connected to the second diode and another end connected to a ground, and a detected voltage output terminal directly connected to a junction between the first diode and the second diode. The sum of a detected voltage generated by the first diode and a DC offset voltage caused by the bias voltage appears at the detected voltage output terminal. The first resistor has a resistance value different from that of the second resistor, and those resistance values are set to compensate for variations in the detected voltage with temperature.

2 Claims, 3 Drawing Sheets

DETECTOR AND TRANSMITTER INCORPORATING THE DETECTOR

BACKGROUND OF THE INVENTION

1. Field of the Invention

The present invention relates to a detector for detecting the level of an output of a transmitter, such as a mobile radio transmitter, for transmitting, as its output, a high-frequency signal, and a transmitter incorporating the detector.

2. Description of the Prior Art

Referring now to FIG. 4, it illustrates a schematic circuit diagram showing the structure of a prior art detector used for detecting the level of an output of a transmitter for transmitting, as its output, a high-frequency signal. In the figure, reference numeral 41 denotes an input terminal to which the high-frequency signal to be detected by the detector is applied, numeral 42 denotes a capacitor having an end connected to the input terminal 41, and numeral 43 denotes a detecting diode having an anode connected to another end of the capacitor 42. In addition, reference numeral 44 denotes a first resistor having an end connected to a junction between the capacitor 42 and the detecting diode 43, and another end connected to a bias supplying unit 45 for supplying a predetermined bias voltage to the detecting diode, numeral 48 denotes a capacitor having an end connected to a cathode of the detecting diode 43 and a detected voltage output terminal 46, and another end connected to a ground, and numeral 49 denotes a second resistor having an end connected to the cathode of the detecting diode 43 and the detected voltage output terminal 46, and another end connected to the ground. The first and second resistors 44 and 49 define a bias current flowing through the detecting diode 43. The capacitor 48 is charged by the high-frequency signal, which has been half-wave rectified by the detecting diode 43.

The prior art detector as shown in FIG. 4 is so constructed as to make a bias current flow through the detecting diode 43 in order to detect a high-frequency signal at a relatively low level. The high-frequency signal to be detected is supplied from the input terminal 41, by way of the capacitor 42, to the anode of the detecting diode 43. The capacitor 42 serves as a bypass capacitor to cut off the DC component of the high-frequency signal applied to the detector and to allow its high-frequency components to pass therethrough.

Unless any high-frequency signal is applied to the input terminal 41, the bias current supplied from the bias supplying unit 45 flows through the first resistor 44, the detecting diode 43, and the second resistor 49. The bias current has a value determined by the quotient of (the bias voltage from the bias supplying unit 45– the forward voltage VF of the detecting diode 43) by the sum of the resistances of the first and second resistors 44 and 49.

When a high-frequency signal is applied to the input terminal 41, the high-frequency signal passes through the bypass capacitor 42 and the sum of the voltage Vin of the high-frequency signal and the forward voltage VF is then applied to the detecting diode 43. The waveforms of instantaneous currents flowing through the detecting diode 43 in the positive and negative halves of each cycle of the input high-frequency signal are asymmetrical to each other because the conductance of the detecting diode 43 largely varies according to the direction of the voltage across the detecting diode.

The capacitor 48 is charged by the instantaneous current flowing through the detecting diode in the positive half of each cycle. In the next negative half of each cycle, the capacitor 48 discharges and the instantaneous current therefore flows through the second resistor 49 to the ground. As a result, the total current flowing through the resistance component of the detected voltage output terminal 46 is the sum of the bias current supplied from the bias supplying unit 45 and the instantaneous current caused by the high-frequency signal. Thus the voltage signal that appears at the detected voltage output terminal 46 has a value corresponding to the level of the input high-frequency signal.

A problem with the prior art detector shown is that it has a detection characteristic showing temperature dependence, that is, the detecting diode 43 has a conductance that can vary with temperature. A change in the forward voltage VF with temperature can cause a change in the detected voltage that appears at the detected voltage output terminal 46 even though the same bias current is caused to flow through the detector.

Referring next to FIG. 5, it illustrates a schematic circuit diagram showing the structure of another detector as disclosed in Japanese Patent Application Publication (TOKKAIHEI) No. 8-330850, which is proposed to solve the above problem. In the figure, the same reference numerals as shown in FIG. 4 denote the same components as of the former prior art detector, and therefore the description of these components will be omitted hereinafter. In FIG. 5, reference numeral 47 denotes a temperature-compensation diode having an anode connected to the cathode of a detecting diode 43, and a cathode connected to an end of a resistor 49, numeral 50 denotes a resistor having an end connected to a junction between the detecting diode 43 and the temperature-compensation diode 47, and another end connected to a detected voltage output terminal 46, numeral 51 denotes a resistor having an end connected to the cathode of the temperature-compensation diode 47, and another end connected to the detected voltage output terminal 46, and numeral 52 denotes a capacitor having an end connected to a junction between the detecting diode 43 and the temperature-compensation diode 47, and another end connected to a ground. The capacitor 52 serves as a bypass capacitor for preventing a high-frequency voltage supplied to the detecting diode 43 from being supplied to the temperature-compensation diode 47. Two diodes having the same characteristics can be used as the detecting diode 43 and the temperature-compensation diode 47. For example, Schottky barrier diodes encapsulated in the same package are used. The first and second resistors 44 and 49 have the same resistance value.

Assuming that the sum of the resistance values of the third and fourth resistors 50 and 51 is sufficiently greater than the resistance value of the temperature-compensation diode 47 at its operating point, the bias current, which flows through the series circuit consisting of the first resistor 44, the detecting diode 43, the temperature-compensation diode 47, and the second resistor 49, has a value determined by the quotient of {the bias voltage from the bias supplying unit 45– (the forward voltage VF of the detecting diode 43+ the forward voltage VF of the temperature-compensation diode 47)} by the sum of the resistance values of the first and second resistors 44 and 49 when a high-frequency signal is applied to the input terminal 41. Since the forward voltage VF of each of the detecting and temperature-compensation diodes 43 and 47 has a negative temperature coefficient, the bias current has a positive temperature coefficient. Similarly, the voltage that appears at a junction c between the temperature-compensation diode 47 and the resistor 49 has a positive temperature coefficient. On the other hand, the voltage that appears at a junction b between the detecting diode 43 and the temperature-compensation diode 47 has a constant value equal to one-half of the bias voltage because the junction b sits right at the center of the series circuit consisting of the first and second resistors 44 and 49, and the two diodes 43 and 47. As a result, the DC offset voltage at the detected voltage output terminal 46 has a positive temperature coefficient because it has a value corresponding to the division of the voltage between the junctions b and c using the third and fourth resistors 50 and 51.

When a high-frequency signal is applied to the input terminal 41, the high-frequency signal passes through the bypass capacitor 42 and the sum of the voltage Vin of the high-frequency signal and the forward voltage VF is then applied to the detecting diode 43, as previously mentioned. The waveforms of instantaneous currents flowing through the detecting diode 43 in the positive and negative halves of each cycle of the input high-frequency signal are asymmetrical to each other because the conductance of the detecting diode 43 largely varies according to the direction of the voltage across the detecting diode. As a result, the average current increases and a DC component therefore emerges. The high-frequency components of the instantaneous current pass through the bypass capacitor 52 and then flows into the ground. On the other hand, the bypass current increases the voltage that appears at the junction b between the detecting diode 43 and the temperature-compensation diode 47, and an envelope signal integrated by the resistor 50 and the capacitor 48 emerges at the detected voltage output terminal 46.

The conductance of each of the detecting and temperature-compensation diodes 43 and 47 has a negative temperature coefficient, and the detected voltage that appears at the detected voltage output terminal 46 therefore has a negative temperature coefficient. Since the total voltage that appears at the detected voltage output terminal 46 is the sum of the DC offset voltage having a positive temperature coefficient and the detected voltage having a negative temperature coefficient, it is possible to make the detection characteristics of the prior art detector remain unchanged with temperature by setting the ratio of dividing the voltage between the junctions b and c using the resistors 50 and 51 to a proper value.

However, a problem with the prior art detector constructed as above is that the magnitude of the detected output is reduced. Since in the prior art detector as shown in FIG. 5 the detected output obtained from the detected voltage output terminal 46 is the division of a voltage detected by the detecting diode 43 using the third and fourth resistors 50 and 51, the detected output inherently has a lower value than the detected voltage. In the prior art detector, a larger input power has to be applied to the input terminal 41 to increase the voltage of the detected output, and therefore there is a need to increase the degree of coupling of a directional coupler disposed at the front of the detector. However, an increase in the degree of coupling can increase losses produced between a power amplifier and a transmission antenna included with a transmitter incorporating the detector, thus reducing the magnitude of an output transmitted via the transmission antenna and hence increasing the power consumption. Accordingly, a detector capable of furnishing an output having as high a voltage as possible for a limited input power, that is, a high-efficiency detector is best suited to transmitters. The prior art detector as shown in FIG. 5 cannot meet such a demand.

SUMMARY OF THE INVENTION

The present invention is proposed to solve the above problem. It is therefore an object of the present invention to provide a detector capable of precisely detecting a high-frequency signal applied thereto with efficiency and regardless of variations in the temperature of the detector, and a transmitter incorporating the detector.

In accordance with one aspect of the present invention, there is provided a detector comprising: a first diode for detecting a high-frequency signal applied to the detector; a bias unit for supplying a predetermined bias voltage to the first diode; a first resistor having an end connected to the bias unit and another end connected to the first diode; a second diode connected in series with the first diode and having a same characteristic as the first diode; a second resistor having an end connected to the second diode and another end connected to a ground; and a detected voltage output terminal directly connected to a junction between the first diode and the second diode, a sum of a detected voltage generated by the first diode and a DC offset voltage caused by the bias voltage appearing at the detected voltage output terminal, the first resistor having a resistance value different from that of the second resistor, and those resistance values being set to compensate for variations in the detected voltage with temperature. Preferably, the bias unit includes two resistors for dividing a power supply voltage to generate a lower voltage and for furnishing the lower voltage, as the bias voltage, to the first diode by way of the first resistor.

In accordance with another aspect of the present invention, there is provided a transmitter including an amplifying unit for amplifying a high-frequency signal, a detector for detecting the high-frequency signal amplified by the amplifying unit, and a control unit for controlling a gain of the amplifying unit according to an output of the detector, the detector comprising: a first diode for detecting a high-frequency signal applied to the detector; a bias unit for supplying a predetermined bias voltage to the first diode; a first resistor having an end connected to the bias unit and another end connected to the first diode; a second diode connected in series with the first diode and having a same characteristic as the first diode; a second resistor having an end connected to the second diode and another end connected to a ground; and a detected voltage output terminal directly connected to a junction between the first diode and the second diode, a sum of a detected voltage generated by the first diode and a DC offset voltage caused by the bias voltage appearing at the detected voltage output terminal, the first resistor having a resistance value different from that of the second resistor, and those resistance values being set to compensate for variations in the detected voltage with temperature. Preferably, the bias unit includes two resistors for dividing a power supply voltage to generate a lower voltage and for furnishing the lower voltage, as the bias voltage, to the first diode by way of the first resistor.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1

Figure 1:
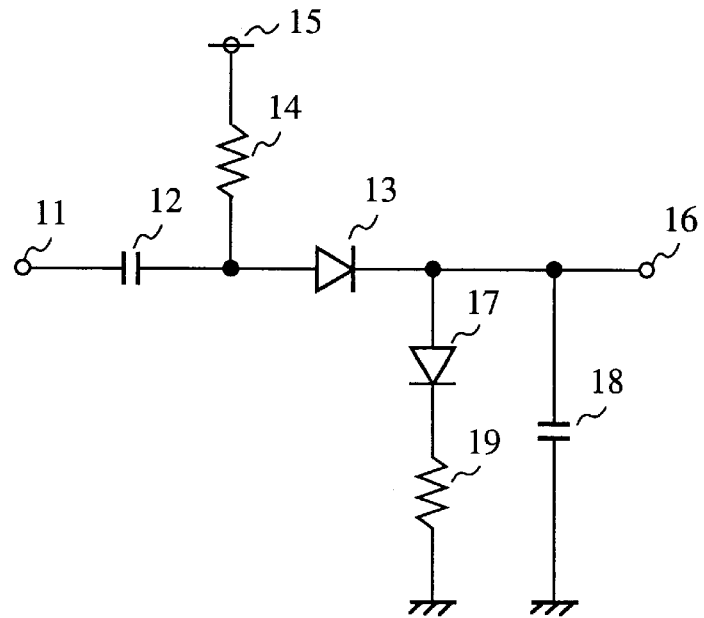
FIG. 1 is a schematic circuit diagram showing the structure of a detector according to a first embodiment of the present invention.

Referring next to FIG. 1, it illustrates a block diagram showing the structure of a detector according to a first embodiment of the present invention. In the figure, reference numeral 11 denotes an input terminal to which a high-frequency signal to be detected by the detector of the first embodiment is applied, numeral 12 denotes a capacitor having an end connected to the input terminal 11, and numeral 13 denotes a first diode or detecting diode having an anode connected to another end of the capacitor 12. The capacitor 12 is a bypass capacitor to cut off the DC component of the high-frequency signal applied to the detector. In addition, reference numeral 14 denotes a first resistor having an end connected to a junction between the capacitor 12 and the detecting diode 13, and another end connected to a bias supplying unit 15 for supplying a predetermined bias voltage to the detecting diode, numeral 16 denotes a detected voltage output terminal directly connected to a cathode of the detecting diode 13, numeral 17 denotes a second diode or temperature-compensation diode connected in series to the detecting diode 13 and having an anode connected to the detected voltage output terminal 16 and the cathode of the detecting diode 13, for temperature-compensating for the bias voltage, and numeral 18 denotes a capacitor having an end connected to the detected voltage output terminal 16 and the cathode of the detecting diode 13, like the temperature-compensation diode 17. The capacitor 18 has another end connected to a ground. The temperature-compensation diode 17 has a cathode connected, by way of a second resistor 19, to the ground. The first and second resistors 14 and 19 determine a bias current flowing through a series circuit consisting of those resistors, the detecting diode 13, and the temperature-compensation diode 17. The first resistor 14 has a resistance value that is slightly greater than that of the second resistor 19. The resistance values of those resistors 14 and 19 are predetermined so as to cancel out a negative temperature coefficient of a detected voltage that appears at the detected voltage output terminal 16, as will be described later. The capacitor 18 is charged by the high-frequency signal half-wave rectified by the detecting diode 13.

Unless any high-frequency signal is applied to the input terminal 11, the bias current supplied from the bias supplying unit 15 flows through the series circuit consisting of the first resistor 14, the detecting diode 13, the temperature-compensation diode 17, and the second resistor 19. The bias current has a value determined by the quotient of {the bias voltage from the bias supplying unit 15−(the forward voltage VF of the detecting diode 13+the forward voltage VF of the temperature-compensation diode 17)} by the sum of the resistance values of the first and second resistors 14 and 19.

Two diodes having the same characteristics can be used as the detecting and temperature-compensation diodes 13 and 17. For example, Schottky barrier diodes encapsulated in the same package are used. The conductance of the detecting diode 13 therefore varies with temperature in the same way that that of the temperature-compensation diode 17 varies with temperature. Then the DC offset voltage Vo that appears at the detected voltage output terminal 16, which is caused by the bias current, can be given by the following equation:

$$Vo = Vb\,(R19 + Rd)/(R14 + R19 + 2Rd)$$

where Rd is the resistance value of each of those diodes, Vb is the bias voltage supplied from the bias supplying unit 15, R14 is the resistance value of the first resistor 14, and R19 is the resistance value of the second resistor 19. Since R14 >R19, as previously mentioned, it is apparent from the above equation that the DC offset voltage Vo increases with an increase in Rd. Accordingly, as the conductance of each of the detecting and temperature-compensation diodes 13 and 17 decreases with an increase in the temperature of each of them, the DC offset voltage Vo increases. The DC offset voltage Vo thus has a positive temperature coefficient.

When a high-frequency signal is applied to the input terminal 11, the high-frequency signal passes through the bypass capacitor 12 and the sum of the voltage Vin of the high-frequency signal and the forward voltage VF is then applied to the detecting diode 13. The waveforms of instantaneous currents flowing through the detecting diode 13 in the positive and negative halves of each cycle of the input high-frequency signal are asymmetrical to each other because the conductance of the detecting diode 13 largely varies according to the direction of the voltage across the detecting diode.

In the positive half of each cycle of the input high-frequency signal, high-frequency components of the instantaneous current flow through the capacitor 18 and then to the ground. Accordingly, when the instantaneous current flows through the detecting diode in the positive half of each cycle, the capacitor 18 is charged by the instantaneous current. In the next negative half of each cycle, the capacitor 18 then discharges and the instantaneous current therefore flows through the temperature-compensation diode 17 and the second resistor 19 to the ground. As a result, the total current flowing through the temperature-compensation diode 17 and the second resistor 19 is the sum of the bias current supplied from the bias supplying unit 15 and the instantaneous current caused by the high-frequency signal, and the total voltage that appears at the detected voltage output terminal 16 is the sum of the DC offset voltage caused by the bias current and the detected voltage of the high-frequency signal. Thus the voltage signal that appears at the detected voltage output terminal 16 has a value corresponding to the level of the input high-frequency signal.

The conductance of each of the detecting and temperature-compensation diodes 13 and 17 has a negative temperature coefficient, as previously mentioned, and therefore the detected voltage that appears at the detected voltage output terminal 16 has a negative temperature coefficient. Since the total voltage that appears at the detected voltage output terminal 16 is the sum of the DC offset voltage having a positive temperature coefficient and the detected voltage having a negative temperature coefficient, it is possible to make the detection characteristics of the detector remain unchanged with temperature by setting the resistance values of the first and second resistors 14 and 19 so as to cancel out the negative temperature coefficient of the detected voltage, that is, to compensate for variations in the detected voltage with temperature.

As previously explained, in accordance with the first embodiment of the present invention, the detector comprises the series circuit consisting of the first resistor 14, the detecting diode 13, the temperature-compensation diode 17, and the second resistor 19. In addition, the first resistor 14 has a larger resistance value than the second resistor 19 does, and these resistance values are set so as to cancel out variations in the detected voltage that appears in the detected voltage output terminal 16, which is caused by its own negative temperature coefficient. Thus the first embodiment offers an advantage of being able to precisely detect the input high-frequency signal regardless of variations in the temperature of each of the detecting and temperature-compensation diodes.

Figure 5:
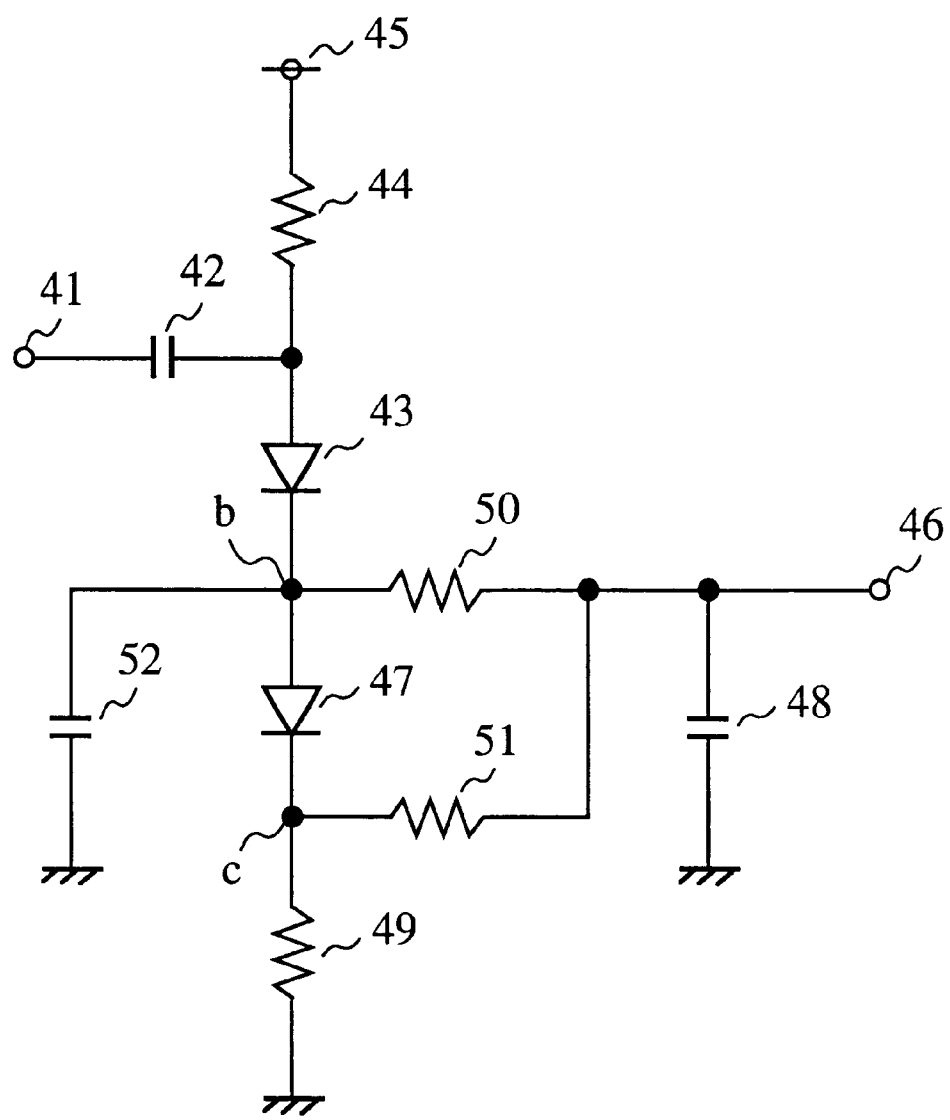
FIG. 5 is a schematic circuit diagram showing the structure of another prior art detector.

Unlike the above-mentioned prior art detector of FIG. 5, since the detector of the present embodiment does not divide the detected voltage from the detecting diode 13 using two other resistors, the first embodiment offers another advantage of being able to detect the high-frequency signal with efficiency. Furthermore, the first embodiment provides a further advantage of reducing the number of components included with the detector because no resistor is needed for dividing the detected voltage, thus downsizing the detector and reducing the cost.

Embodiment 2

Figure 2:
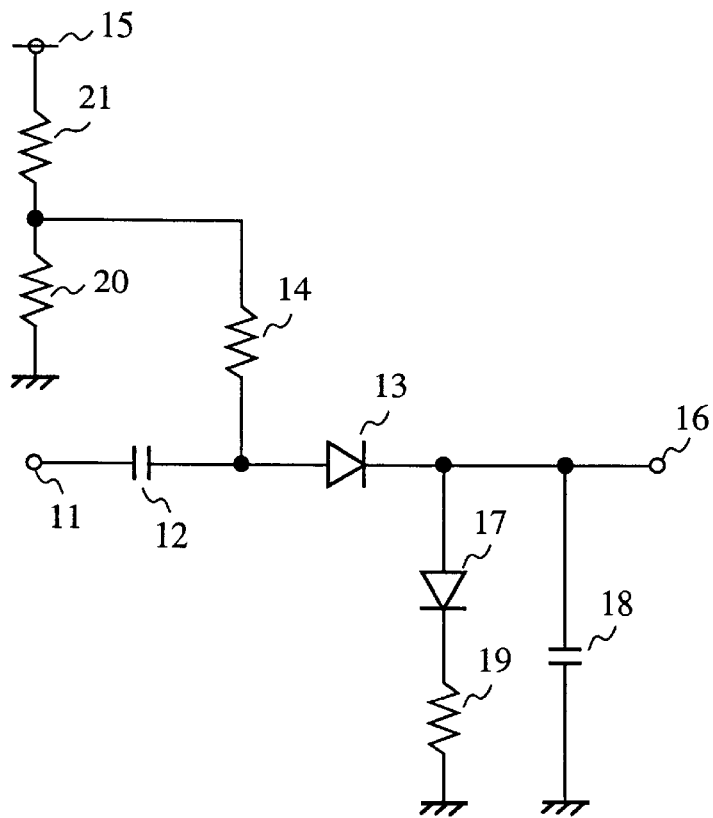
FIG. 2 is a schematic circuit diagram showing the structure of a detector according to a second embodiment of the present invention.

Referring next to FIG. 2, it illustrates a schematic circuit diagram showing the structure of a detector according to a second embodiment of the present invention. In the figure, the same components as of the above-mentioned first embodiment are designated by the same reference numeral as shown in FIG. 1, and therefore the description of those components will be omitted hereinafter. In FIG. 2, reference numeral 20 denotes a third resistor having an end connected to one end of a first resistor 14, and another end connected to a ground, and numeral 21 denotes a fourth resistor having an end connected to a bias supplying unit 15, and another end connected to the end of the third resistor 20 and the end of the first resistor 14.

The detector according to the second embodiment divides a bias voltage supplied from the bias supplying unit 15 using the third and fourth resistors 20 and 21, and then supplies a reduced bias voltage, by way of the first resistor 14, to the anode of a detecting diode 13. The first, second, and fourth resistors 14, 19 and 21 are set so that the sum of the resistance values of the first and fourth resistors 14 and 21 is greater than that of the second resistor 19. In addition, those resistance values are set so as to cancel out the negative temperature coefficient of a detected voltage that appears at a detected voltage output terminal 16, that is, to compensate for variations in the detected voltage with temperature. On the other hand, in order to provide a stable bias voltage that is unaffected by the detected voltage, the resistance value of the third resistor 20 is set so that it is sufficiently greater than the sum of the resistance values of the first and fourth resistors 14 and 21.

Basically, the detector according to the second embodiment operates like the detector according to the above-mentioned first embodiment does. Accordingly, the description will be directed to a difference between the first and second embodiments.

In general, when a power supply of 3.0 Volts is used as the bias supplying unit 15 of the detector according to the first embodiment as shown in FIG. 1, the detector furnishes an output or DC offset voltage of about 1.5 Volts unless it detects a high-frequency signal. On the other hand, a transmitter into which the detector is incorporated can read the detected voltage from the detector by means of an A/D converter, and can control its transmission output according to a digital output form the A/D converter in such a manner that the output remains constant. Since a voltage range that the A/D converter can read is generally between 0 Volts to a power supply voltage, the dynamic range of the A/D converter cannot be used effectively because the dynamic range is reduced by the DC offset voltage of about 1.5 Volts. This results in substantially reducing the dynamic range by half. It is therefore desirable to apply as low a bias voltage as possible to the series circuit consisting of the first resistor 14, the detecting diode 13, the temperature-compensation diode 17, and the second resistor 19.

When a power supply voltage is used as the bias supplying unit 15, the power supply voltage is divided by the third and fourth resistors 20 and 21. A voltage across the third resistor 20 is thus supplied, as the bias voltage, to the series circuit of the detector according to the second embodiment. The bias voltage can be set to an arbitrary value ranges from 0 Volts to the power supply voltage by setting the resistance values of the third and fourth resistors 20 and 21 to arbitrary ones. It is, however, noted that setting of the resistance value of the third resistor 20 to be sufficiently less than the sum of the resistance values of the first and second resistors 14 and 19 creates a stable bias voltage that is unaffected by the detected voltage. In this case, while the sum of the resistance values of the first and fourth resistors 14 and 21 must be that of the second resistor 19, those resistance values must be set so as to cancel out the negative temperature coefficient of the detected voltage that appears in the detected voltage output terminal 16.

As previously explained, in accordance with the second embodiment, the detector further comprises the third and fourth resistors 20 and 21 for dividing the output of the bias supplying unit 15 in order to apply a lower bias voltage to the series circuit. Accordingly, the second embodiment offers an advantage of being able to generate a bias voltage that is as low as possible and that is unaffected by the detected voltage.

Embodiment 3

Figure 3:
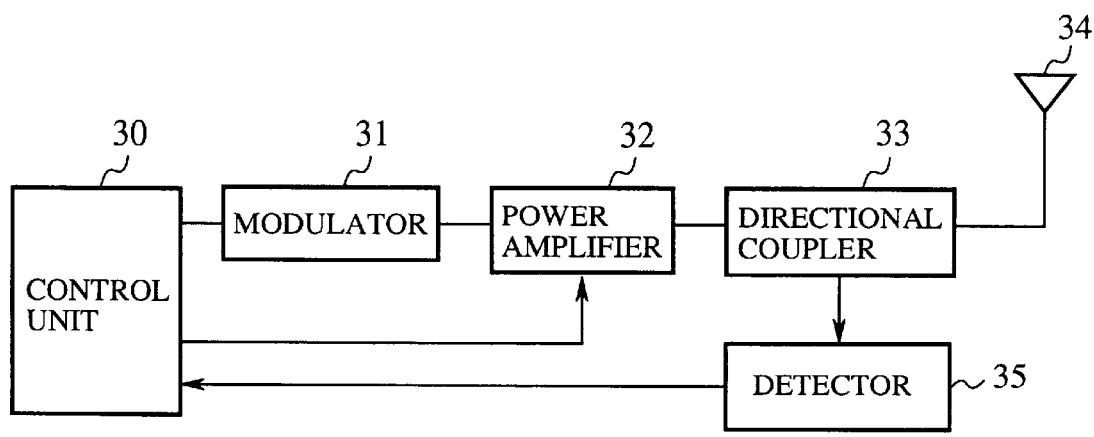
FIG. 3 is a schematic circuit diagram showing the structure of a transmitter according to a third embodiment of the present invention.
Figure 4:
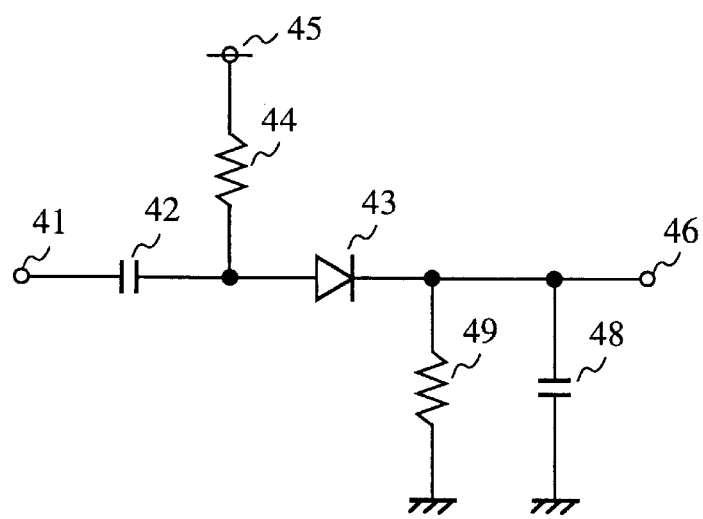
FIG. 4 is a schematic circuit diagram showing the structure of a prior art detector.

Referring next to FIG. 3, it illustrates a block diagram showing the structure of a transmitter, such as a mobile radio transmitter, for transmitting a high-frequency signal, according to a third embodiment of the present invention, into which the detector according to the above-mentioned first or second embodiment is incorporated. In the figure, reference numeral 30 denotes a control unit for generating a transmission signal from a voice signal generated by a microphone (not shown), or the like, numeral 31 denotes a modulator for modulating the transmission signal from the control unit 30 and for furnishing the modulated high-frequency signal, and numeral 32 denotes a power amplifier for power amplifying the high-frequency signal from the modulator 31 with an amplification factor or gain controlled by the control unit 30, and for furnishing the amplified high-frequency signal, by way of a directional coupler 33, to a transmission antenna 34. While the directional coupler 33 supplies most of the amplified high-frequency signal from the power amplifier 32 to the transmission antenna 34, it furnishes the remainder of the amplified high-frequency signal to the detector 35. As previously mentioned, the detector 35 is the one according to the above-mentioned first or second embodiment, which detects the remainder of the amplified high-frequency signal from the directional coupler 33 and then furnishes a detected output to the control unit 30.

In operation, the control unit 30 converts a voice signal generated by the microphone not shown or the like into an equivalent digital signal and then furnishes it as a transmission signal to the modulator 31. The modulator 31 quadrature-modulates the transmission signal using a carrier wave from the control unit 30 to furnish the modulated high-frequency signal to the power amplifier 32. The power amplifier 32 then power-amplifies the high-frequency signal from the modulator 31 with an amplification factor or gain controlled by the control unit 30, and furnishes the amplified high-frequency signal to the directional coupler 33. While the directional coupler 33 supplies most of the amplified high-frequency signal from the power amplifier 32 to the transmission antenna 34, it furnishes the remainder of the amplified high-frequency signal to the detector 35.

The detector 35 detects the remainder of the amplified high-frequency signal from the directional coupler 33 so as to detect the output level of the transmission signal furnished via the transmission antenna 34. As previously mentioned in Embodiment 1, the detector 35 can precisely detect the input high-frequency signal regardless of variations in the temperature of the detector.

The control unit 30 controls the amplification factor or gain of the power amplifier 32 so that the detected output of the detector 35 remains constant. As a result, the level of the high-frequency signal radiated from the transmission antenna 34 is maintained constant.

As previously mentioned, in accordance with the third embodiment, the transmitter incorporates the detector according to the above-mentioned first or second embodiment. Thus the first embodiment offers an advantage of being able to precisely detect the input high-frequency signal and hence keep the level of the high-frequency signal radiated from the transmission antenna 34 constant regardless of variations in the temperature of the detector. In addition, since the detector 35 does not divide the detected voltage from the detecting diode 13 using two other resistors, the third embodiment offers another advantage of being able to detect the high-frequency signal with efficiency.

Furthermore, when the transmitter incorporates the detector of the first embodiment including a lower number of components, the third embodiment provides a further advantage of downsizing the transmitter and reducing the cost.

Many widely different embodiments of the present invention may be constructed without departing from the spirit and scope of the present invention. It should be understood that the present invention is not limited to the specific embodiments described in the specification, except as defined in the appended claims.

What is claimed is:

1. A detector, comprising:
   a first diode for detecting a high-frequency signal applied to an input terminal of said detector;
   a bias means for supplying a predetermined bias voltage to said first diode;
   a first resistor having one end connected to said bias means and another end connected to said first diode;
   a second diode connected in series with said first diode and having a same characteristic as said first diode;
   a second resistor having one end connected to said second diode and another end connected to ground; and
   a detected voltage output terminal directly connected to a junction between said first diode and said second diode, a sum of a detected voltage generated by said first diode and a DC offset voltage caused by the bias voltage appearing at said detected voltage output terminal,
   said first resistor having a resistance value different from that of said second resistor, such resistance values being set to compensate for variations in the detected voltage with temperature; wherein
   said bias means includes a pair of resistors for dividing a power supply voltage to develop a lower voltage than said power supply voltage and for furnishing said lower voltage to said first diode as said bias voltage via said first resistor.

2. A transmitter, including an amplifying means for amplifying a high-frequency signal, a detector for detecting the high-frequency signal amplified by said amplifying means, and a control means for controlling a gain of said amplifying means according to an output of said detector, said detector comprising:
   a first diode for detecting a high-frequency signal applied to an input terminal of said detector;
   a bias means for supplying a predetermined bias voltage to said first diode;
   a first resistor having one end connected to said bias means and another end connected to said first diode;
   a second diode connected in series with said first diode and having a same characteristic as said first diode;
   a second resistor having one end connected to said second diode and another end connected to ground; and
   a detected voltage output terminal directly connected to a junction between said first diode and said second diode, a sum of a detected voltage generated by said first diode and a DC offset voltage caused by the bias voltage appearing at said detected voltage output terminal,
   said first resistor having a resistance value different from that of said second resistor, such resistance values being set to compensate for variations in the detected voltage with temperatures; wherein
   said bias means includes a pair of resistors for dividing a power supply voltage to develop a lower voltage than said power supply voltage and for furnishing said lower voltage to said first diode as said bias voltage via said first resistor.

* * * * *